(12) United States Patent
Kruit et al.

(10) Patent No.: US 9,697,985 B2
(45) Date of Patent: Jul. 4, 2017

(54) APPARATUS AND METHOD FOR INSPECTING A SURFACE OF A SAMPLE

(71) Applicant: Technische Universiteit Delft, Delft (NL)

(72) Inventors: Pieter Kruit, Delft (NL); Ali Mohammadi-Gheidari, Delft (NL); Yan Ren, Delft (NL)

(73) Assignee: Technische Universiteit Delft, Delft (NL)

( * ) Notice: Subject to any disclaimer, the term of this patent is extended or adjusted under 35 U.S.C. 154(b) by 0 days.

(21) Appl. No.: 14/408,137

(22) PCT Filed: Jun. 12, 2013

(86) PCT No.: PCT/NL2013/050416
§ 371 (c)(1),
(2) Date: Dec. 15, 2014

(87) PCT Pub. No.: WO2013/191539
PCT Pub. Date: Dec. 27, 2013

(65) Prior Publication Data
US 2015/0179399 A1    Jun. 25, 2015

(30) Foreign Application Priority Data
Jun. 22, 2012  (NL) ..................... 2009053

(51) Int. Cl.
*H01J 37/244* (2006.01)
*H01J 37/28* (2006.01)
*H01J 37/14* (2006.01)

(52) U.S. Cl.
CPC .......... *H01J 37/244* (2013.01); *H01J 37/14* (2013.01); *H01J 37/28* (2013.01); *H01J 2237/2446* (2013.01); *H01J 2237/2448* (2013.01)

(58) Field of Classification Search
None
See application file for complete search history.

(56) References Cited

U.S. PATENT DOCUMENTS

| 2002/0088940 A1* | 7/2002 | Watanabe | H01J 37/224 250/310 |
| 2003/0168606 A1* | 9/2003 | Adamec | H01J 37/04 250/396 R |

(Continued)

FOREIGN PATENT DOCUMENTS

| CN | 101131909 | 2/2008 |
| CN | 101137889 | 3/2008 |

(Continued)

OTHER PUBLICATIONS

Official Action issued in Chinese Application No. 201380031526.X on Mar. 21, 2016.

(Continued)

*Primary Examiner* — Michael Logie
(74) *Attorney, Agent, or Firm* — Dann, Dorgman, Herrell and Skillman; Stephen Eland

(57) ABSTRACT

The invention relates to an apparatus for inspecting a surface of a sample, wherein the apparatus comprises: at least one charged particle source for generating an array of primary charged particle beams, a condenser lens for directing all charged particle beams to a common cross-over, a lens system for directing the primary charged particle beams from the common cross-over towards the sample surface and for focusing all primary charged particle beams into an array of individual spots on the sample surface, and a position sensitive secondary electron detector positioned at least substantially in or near a plane comprising said common cross-over.

18 Claims, 5 Drawing Sheets

(56) References Cited

U.S. PATENT DOCUMENTS

| | | |
|---|---|---|
| 2006/0169910 A1 | 8/2006 | Frosien et al. |
| 2008/0042059 A1 | 2/2008 | Tashiro et al. |
| 2008/0067376 A1 | 3/2008 | Tanimoto et al. |
| 2008/0067384 A1 | 3/2008 | Ikku et al. |
| 2008/0149831 A1* | 6/2008 | Saito .................... G01N 23/203 250/310 |
| 2010/0200748 A1* | 8/2010 | Adamec ................ H01J 37/244 250/307 |
| 2010/0320382 A1* | 12/2010 | Almogy ................. H01J 37/05 250/307 |
| 2012/0241606 A1* | 9/2012 | Han ................... G01N 23/2251 250/307 |

FOREIGN PATENT DOCUMENTS

| | | | | |
|---|---|---|---|---|
| JP | 2006510184 | | 3/2006 | |
| JP | 2007317467 | | 12/2007 | |
| JP | 2012169091 A | * | 9/2012 | ............. H01J 37/28 |
| WO | WO 2007028596 A1 | * | 3/2007 | ............ H01J 37/045 |

OTHER PUBLICATIONS

Translation of Official Action issued in Chinese Application No. 201380031526.X on Mar. 21, 2016.

Official Action issued in Japanese Application No. 2015-518354 on Mar. 14, 2017.

Translation of Official Action issued in Japanese Application No. 2015-518354 on Mar. 14, 2017.

* cited by examiner

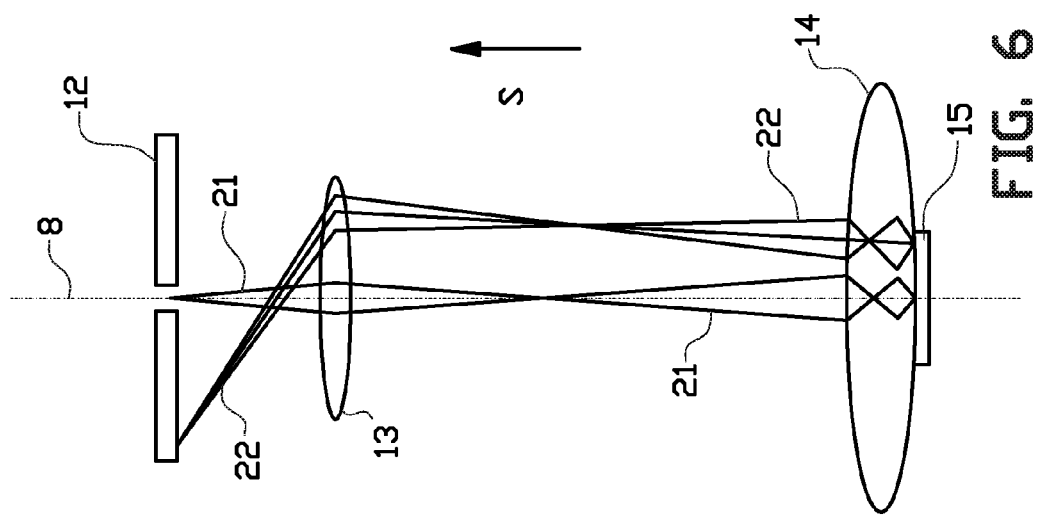
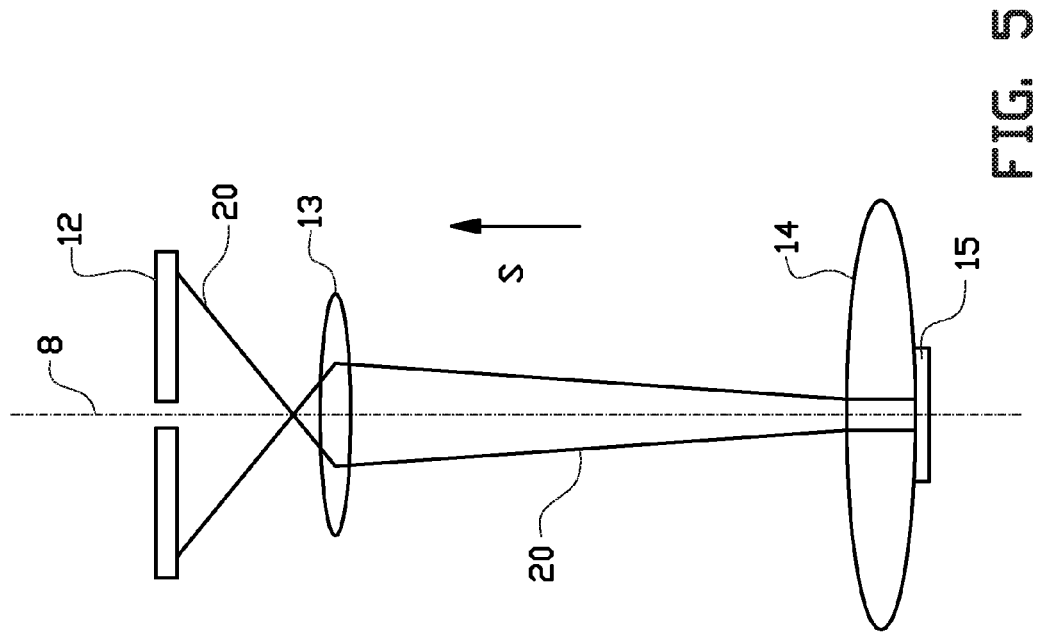

APPARATUS AND METHOD FOR INSPECTING A SURFACE OF A SAMPLE

BACKGROUND

The invention relates to an apparatus and a method for inspecting a surface of a sample. In particular the invention relates to an apparatus for inspecting a sample surface using a plurality of charged particle beams, such as a multi-beam scanning electron microscope. The invention may be applied to charged particles of any type, such as electrons, positrons, ions and others.

Such an apparatus is for example disclosed in U.S. Pat. No. 7,554,094. This US patent discloses an electron microscope comprising a charged particle source for generating an array of primary electron beams. These primary electron beams pass a field lens. Downstream of this field lens, the primary electron beam path is a converging beam path having a cross-over in an intermediate plane upstream of an objective lens. The objective lens directs the primary charged particle beams from the common cross-over towards the sample surface and focuses the primary charged particle beams into an array of individual spots on the sample surface.

From the individual spots of the array of spots on the sample, secondary electrons emanate from the sample surface. In order to detect these secondary electrons, the secondary electron beam path, comprising the plurality of secondary electron beams, is separated from the primary electron beam path. To separate the secondary electron beam path from the primary electron beam path, the known apparatus comprises a beam splitter arrangement between the field lens and the cross-over. The beam splitter utilizes a magnetic field portion to deflect the primary electron beams by an angle β to the right (as viewed in the traveling direction of the primary electron beams) and to deflect the secondary electron beams by an angle γ to the right (as viewed in the traveling direction of the secondary electron beams). After the beam splitter, the separated secondary electron beams are directed towards a detector.

A disadvantage of this system is that the use of the beam splitter as described in U.S. Pat. No. 7,554,094 deteriorates the imaging quality of the apparatus. In other words, the apparatus as described in U.S. Pat. No. 7,554,094 requires a number of additional electron-optical components to correct stigmatism, distortion and/or dispersion introduced by the magnetic field portion, in order to substantially maintain the imaging quality. Additional electron-optical components are arranged both in the primary electron beam path and in the secondary electron beam path.

It is an object of the present invention to provide a multi charged particle beam apparatus for inspecting a sample surface which provides a new detection arrangement for detecting the secondary electrons.

SUMMARY OF THE INVENTION

According to a first aspect, the invention provides an apparatus for inspecting a surface of a sample, wherein the apparatus comprises
a multi beam charged particle generator for generating an array of primary charged particle beams,
a condenser lens for directing all charged particle beams to a common cross-over,
a lens system for directing the primary charged particle beams from the common cross-over towards the sample surface and for focusing all primary charged particle beams into an array of individual spots on the sample surface, and
a position sensitive secondary electron detector positioned at least substantially in or near a plane comprising said common cross-over.

The invention thus provides a simple detection system in which the secondary electrons are detectable without the use of a beam splitter or Wien filter to separate the secondary charged particle beam path from the primary charged particle beam path. The disadvantages inherent with the use of such a beam splitter or Wien filter can thus be avoided.

The invention utilizes the energy difference between the secondary electrons and the primary charged particle, for example in a SEM the energy of the primary electrons is usually from 1 keV to 30 keV and the energy of secondary electrons is usually from 0 eV to 50 eV. The result of this energy difference is that the lens system performs differently for primary charged particles than for secondary electrons. On the one hand, the lens system is arranged for focusing all primary charged particle beams into an array of individual spots on the sample surface. On the other hand, the same lens system is used for directing the secondary electron beams towards the common cross-over. Since the secondary electrons have an energy which is much less than the energy of the primary charged particles, the lens system does not necessarily focus the secondary electrons back into the common cross-over, but is preferably designed to spread the secondary electrons over an area which essentially surrounds the common cross-over. Thus, in or near a plane comprising said common cross-over, most of the secondary electron beams are spatially separated from the primary charged particle beams which are all concentrated in the common cross-over. By positioning a position sensitive secondary electron detector at least substantially in or near a plane comprising said common cross-over, preferably adjacent to and/or surrounding the common cross-over, most of the secondary electron beams can be detected without any interference to the primary charged particle beams.

In an embodiment, the lens system is arranged for projecting the secondary electrons from the individual spots on the sample surface to individual spots on the secondary electron detector. In an embodiment, the lens system is arranged for imaging the sample surface onto the secondary electron detector using the secondary electrons. Because the secondary electrons only originate from the points in the sample surface which are hit by primary electrons, the image is an array of dots. In these embodiments, when the spatial resolution of the position sensitive secondary electron detector is chosen to be sufficiently large, the position sensitive secondary electron detector can acquire an individual secondary electron signal from most of the individual primary charged particle spots on the sample surface. Only the secondary electrons which are projected or imaged back at the position of the common cross-over cannot be detected. The secondary electrons which originated from all other spots can be detected simultaneous and separately for each spot on the sample surface. Accordingly high resolution scanning charged particle microscope images can be made n times the speed of a single beam scanning charged particle microscope, wherein n is substantially equal to the number of secondary beams that are simultaneously and separately detected by the detector. For example, n can be as large as 200, or even more.

In an embodiment, the lens system is arranged for imaging the sample surface onto the secondary electron detector with an optical magnification in a range from 5 to 400 times. The magnification increases the pitch between individual spots of the secondary electron beams on the secondary electron detector, which makes it easier to resolve the individual secondary electron spots in the image on the secondary electron detector.

In an embodiment, said secondary electron detector comprises a hole for passing said primary charged particle beams there-through. Preferably the primary charged particle beam path comprises an optical axis and the secondary electron detector is arranged such that the optical axis passes through the hole, preferably such that the optical axis is arranged substantially at the central axis of the hole. Preferably the secondary electron detector is arranged such that the common cross-over is in or near the hole.

In an embodiment, the lens system comprises a magnetic objective lens. In an embodiment, the apparatus comprises a sample holder which is arranged for positioning the sample surface to be immersed in the magnetic field of the objective lens. Such an arrangement gives low aberrations for the primary electrons, which is an advantage in a microscope. Here an immersion arrangement is even more advantageous, because there must be space between the sample and a non-immersion lens to accelerate the electrons upwards, which would further increase the aberrations of the non-immersion lens. In an immersion lens the acceleration is inside the lens, which reduces aberrations. Also extracting the secondary electrons from the immersion field gives an additional possibility to set the magnification of the projection of the secondary electrons onto the secondary electron detector to a desired value.

In an embodiment, the lens system comprises a single objective lens, preferably a single objective lens for all primary electron beams. Alternatively the lens system comprises an objective lens array having an array of small objective lenses, preferably one lens for each primary electron beam.

In an embodiment, the apparatus comprises a field generator for providing an electrostatic field that accelerates the secondary electrons from the sample surface towards the secondary electron detector. The electrostatic field is arranged to direct the secondary electrons from the sample towards the secondary electron detector and to narrow the opening angle of the secondary electron beams. In addition the electrostatic field is used to balance the focusing requirements in the primary charged particle beams and the secondary electron beams focusing. The electrostatic field is arranged to focus the primary charged particle beams with a good resolution and to focus the secondary electron beams at the specified detection plane with sufficient magnification.

In an embodiment in which the lens system comprises a magnetic objective lens, the field generator is arranged for providing an electrostatic field is between the sample and a pole piece of the magnetic objective lens. In an embodiment, the field generator comprises an electrostatic lens, also called a retarding lens, which is arranged below the magnetic objective lens to form an electrostatic-magnetic objective lens.

In an embodiment, the pitch between the spots on the sample surface is between 0.3 and 30 micrometers. Preferably the pitch is less than 1 micrometer.

In an embodiment, the detector is a CCD camera, a CMOS camera, an array of avalanche photo diodes or photo multipliers or PN junction semiconductor detectors which gets signal from secondary electrons directly.

In an embodiment the detector comprises a fluorescent screen arranged at least substantially in or near a plane comprising said common cross-over and an optical arrangement for conveying photons from the fluorescent screen to a CCD camera, a CMOS camera, an array of avalanche photo diodes or photo multipliers. In this embodiment the CCD camera, CMOS camera, array of avalanche photo diodes or photo multipliers can be arranged at a distance from the charged particle beams.

According to a second aspect, the invention provides a method for inspecting a surface of a sample comprising the steps of:

generating an array of primary charged particle beams using a multi beam charged particle generator;

directing all charged particle beams to a common cross-over using a condenser lens;

directing the primary charged particle beams from the common cross-over towards the sample surface and focusing all primary charged particle beams into an array of individual spots on the sample surface using a lens system; and detecting secondary electrons which originate from the individual spots on the sample surface using a position sensitive secondary electron detector positioned at least substantially in or near a plane comprising said common cross-over.

In an embodiment of this method, the sample surface is moved at constant speed in a first direction while the primary charged particle beams are scanned repeatedly in a second direction at least substantially perpendicular to the first direction. This provides a new way of studying samples with a scanning charged particle beam microscope: off-line microscopy wherein a full sample surface, for example over an area of one square millimeter, is scanned and imaged at nanometer resolution after which the full sample surface is available to the specialist, for example a biologist, for studying and/or inspecting the image on a computer, instead of behind the microscope.

In an embodiment of this method, the position sensitive secondary electron detector comprises pixels which are arranged to detect one particular secondary electron beam and to at least partially separate neighboring secondary electron beams. Preferably the secondary electron beams are at least substantially fully spatially separated on the surface of the secondary electron detector, and the size of the pixels is smaller than the spots of the secondary electron beams on the surface of the secondary electron detector. When the spots of the secondary electron beams are partially overlapping, the one particular secondary electron beam can be distinguished from its neighboring secondary electron beam by analyzing the intensity distribution in the two secondary electron beam spots and acquiring the centers and effective diameters of these spots. From such an analysis the intensity of the individual secondary electron beams can be determined.

In an embodiment of this method, the lens system comprises a scanner for scanning the primary charged particle beams, wherein the method comprises the step of selecting the pixels for detecting one specific secondary electron beam in dependence on the settings of the scanning of the primary charged particle beams by the scanner. This provides a way of undoing a movement of the secondary electron beams on the detector due to the scanning of the primary charged particle beams on the sample surface, which can be provided by providing suitable software to control the secondary electron detector.

The various aspects and features described and shown in the specification can be applied, individually, wherever possible. These individual aspects, in particular the aspects and features described in the attached dependent claims, can be made subject of divisional patent applications.

BRIEF DESCRIPTION OF THE DRAWINGS

The invention will be elucidated on the basis of an exemplary embodiment shown in the attached drawings, in which:

FIG. 5 shows an envelope presentation of the secondary electron beam path in the MBSEM of FIG. 1, FIG. 6 shows the beam path of a two secondary electron beams in the MBSEM of FIG. 1.

DETAILED DESCRIPTION OF THE INVENTION

Figure 1:
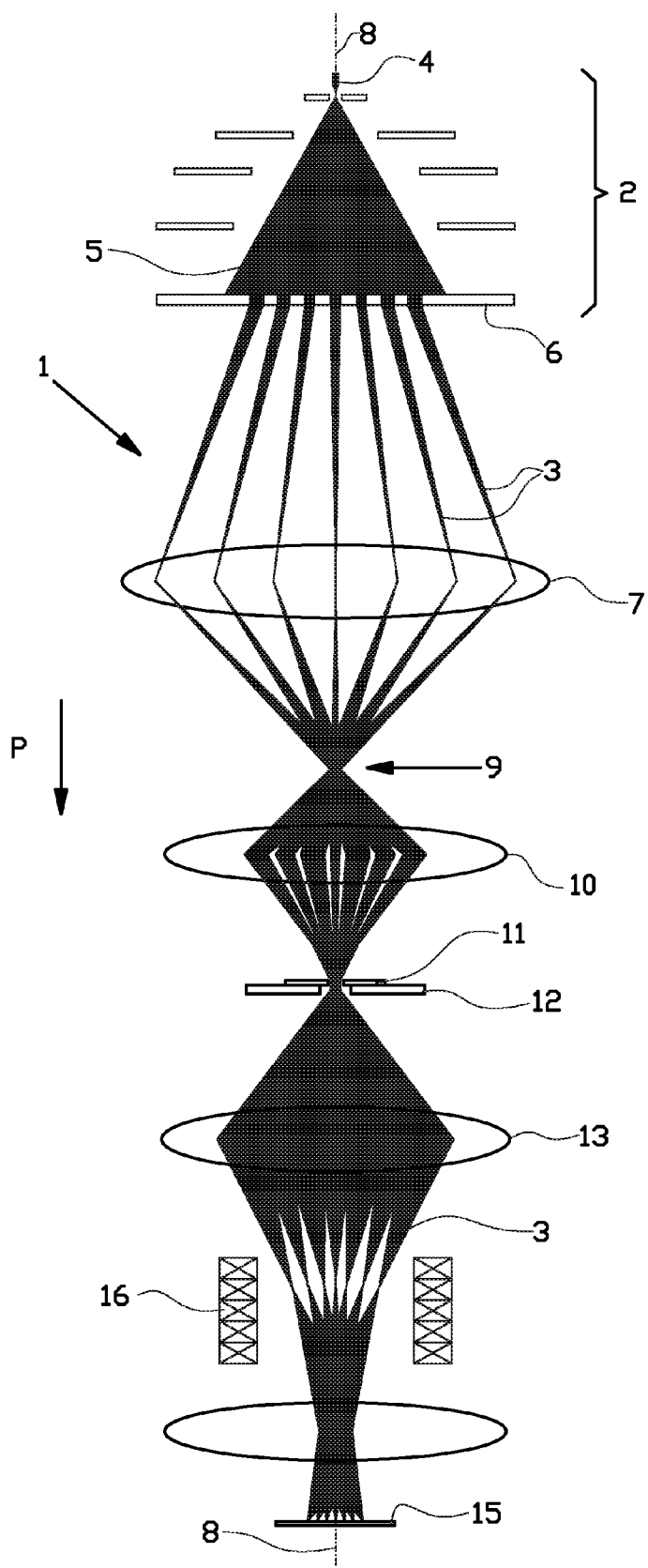
FIG. 1 shows an example of a Multi-Beam Scanning Electron Microscope (MBSEM) of the invention.

FIG. 1 shows an example of a Multi-Beam Scanning Electron Microscope (MBSEM) of the invention.

The MBSEM 1 comprises a multi beam charged particle generator 2 for generating an array of primary charged particle beams 3, in this case an array of primary electron beams 3. The multi beam electron generator 2 comprises at least one electron source 4 for generating a diverging electron beam 5. The diverging electron beam 5 is split into an array of focused primary electron beams 3 by an aperture lens array 6. The primary electron beams 3 are subsequently directed towards a sample 15, as schematically indicated by the arrow P.

The multiple images of the source 4 are positioned on the object principle plane of an accelerator lens 7. The accelerator lens 7 directs the primary electron beams 3 towards the optical axis 8 and creates a first common cross-over 9 of all the primary electron beams 3.

The first common cross-over 9 is imaged by the magnetic condenser lens 10 onto a variable aperture 11 that acts as a current limiting aperture. At the variable aperture 11 a second common cross-over of all the primary electron beams 3 is created.

The MBSEM comprises a lens system 13, 14 for directing the primary charged particle beams from the common cross-over at the variable aperture 11 towards the sample surface 15 and for focusing all primary charged particle beams 3 into an array of individual spots on the sample surface 15. The lens system comprises an intermediate magnetic lens 13 for imaging the variable aperture 11 onto a coma free plane of the objective lens 14, which objective lens 14 creates an array of focused primary electron beams on the sample surface 15.

In addition the MBSEM is provided with scan coils 16 for scanning the array of focused primary electron beams over the sample surface 15.

The MBSEM is furthermore provided with a position sensitive secondary electron detector 12 positioned at least substantially in or near a plane comprising a common cross-over, in this case directly below the variable aperture 11. Alternatively the position sensitive secondary electron detector 12 can be arranged in stead of the variable aperture 11, substantially at the position of the variable aperture 11, as for example shown in FIGS. 2 to 8. This secondary electron detection system 12 is arranged to acquire the individual secondary electron image of each single primary electron beam spot on the sample surface 15. This means, that when the sample surface 15 is scanned in this MBSEM 1, multiple images can be acquired at the same time in one single scan period.

It is preferred that the secondary electron detection system collects most secondary electrons which are emitted over a large energy range and at a large opening angle. Besides, this secondary electron detection system should also work for a large landing energy range of the primary electrons.

It is further preferred that the secondary electron beams are focused in the detection plane with sufficient magnification, for example a magnification in a range from 5 to 400 times. The focusing provides secondary electron beams with a small spot size on the secondary electron detector, and sufficient magnification provides a large pitch between neighboring secondary electron beams in the detection plane. In order to separate the images of different secondary electron beams, the pitch of neighboring secondary electron beams is preferably larger than the spot size of each secondary electron beam in the detection plane.

To achieve this goal, the invention uses in-lens secondary electron detection, which will be explained in more detail below.

Figure 7:
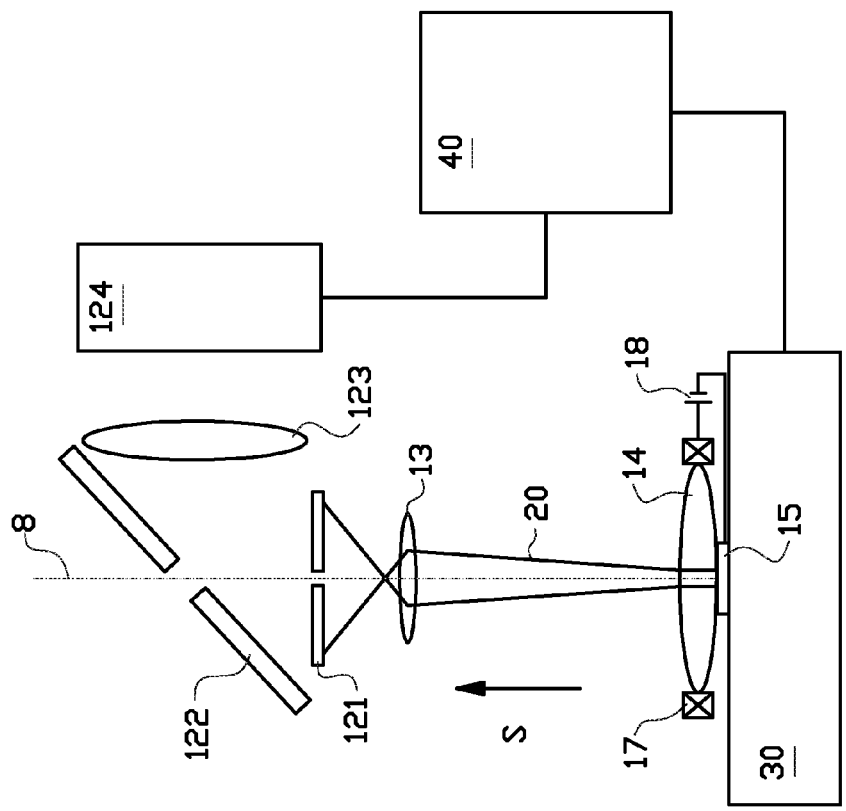
FIG. 7 shows a part of the MBSEM comprising a different detector setup.

Preferably the MBSEM comprises a field generator for providing an electrostatic field that accelerates the secondary electrons from the sample surface towards the secondary electron detector 12, as indicated schematically by the arrow S. The field generator is for example arranged for providing an electrostatic field between the sample surface 15 and pole pieces 17 of the magnetic objective lens 14, as schematically shown in FIG. 7. The generator is for example a voltage source 18 which provides the sample surface 15 with a negative potential with respect to the pole pieces 17.

This set-up of the field generator 18 provides an electrostatic field which operates as an electrostatic lens (retarding lens), which is arranged between the magnetic objective lens 14 and the sample surface 15. The electrostatic lens and the magnetic objective lens 14 together form an electrostatic-magnetic objective lens. This electrostatic-magnetic objective lens accelerates the secondary electrons and narrows their opening angle.

The energy of the secondary electrons is quite small, for example in a range from 0 to 50 eV with a cosine angular distribution. So the electrostatic acceleration field directs the secondary electrons in an upward direction, schematically indicated by the arrow S, with a fast velocity.

After passing through this electrostatic lens, the opening angle α of the secondary electrons with respect to the optical axis is close to:

$$\alpha = \sqrt{E_{SE}/E_{RL}}$$

where $E_{SE}$ is the original energy of secondary electrons. $E_{RL}$ is the energy given to the secondary electrons by the retarding lens. It is well known that in charged particle optics, a paraxial condition is needed to achieve good resolution and other optical property. So in order to minimize the beam spread introduced by the focusing lenses, it is better to employ a high potential difference electrostatic lens to limit this opening angle α when the SE secondary electrons passes it.

Since there is a huge energy difference between energy of the secondary electrons and the energy of the primary electrons, which is usually from 1 KeV to 30 KeV, the focusing conditions of the lens system 13, 14 for primary electrons and secondary electrons are totally different. Also in order to simplify the detection system, avoiding using Wien Filter or other beam splitters as used in the prior art, the same lens system 13, 14 is shared in primary electron and secondary electrons focusing system.

In addition, the electrostatic lens is introduced to balance the focusing requirements in the focusing of the primary and secondary electron beams. The electrostatic lens is arranged to focus the primary electrons with good resolution, and also to focus the secondary electrons at one specified detection plane with sufficient magnification.

The most practical plane to collect the secondary electrons is the variable aperture 11 plane, because it has smallest primary electron spot size, and it is easy to insert a position sensitive secondary electron detector at that location for practical reason.

Accordingly, the apparatus of this example comprises a position sensitive secondary electron detector 12 positioned at least substantially in or near a plane 11 comprising said second common cross-over.

From principle analyses, this MBSEM 1 can be divided into four sub-systems, including single-source system, multi-sources system both for primary electron focusing system and secondary electron detection system. At a certain working distance and a certain landing energy, the focusing lenses make these 4 sub-systems work well.

Figure 2:
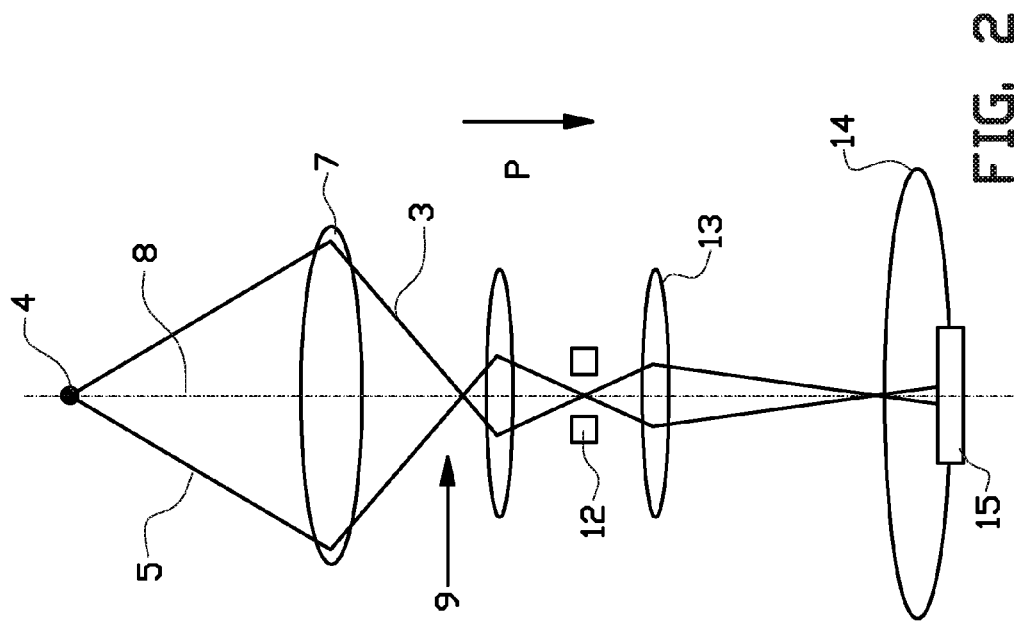
FIG. 2 shows an envelope presentation of the primary electron beam path in the MBSEM of FIG. 1.

The 1st sub-system as shown in FIG. 2 is arranged to form crossovers 9, 11 of multi-beams 3 in certain planes to reduce off-axis aberrations of the whole system. The accelerating lens 7 and condenser lens 10 focus the multi-beam in the variable aperture plane 11. The accelerating lens 7 is adjustable to attain different resolutions and pitches for different applications. Intermediate lens 13 focuses the multi-beams 3 to have a Common cross-over near the coma-free plane of objective lens 14 in order to get small aberrations.

Figure 3:
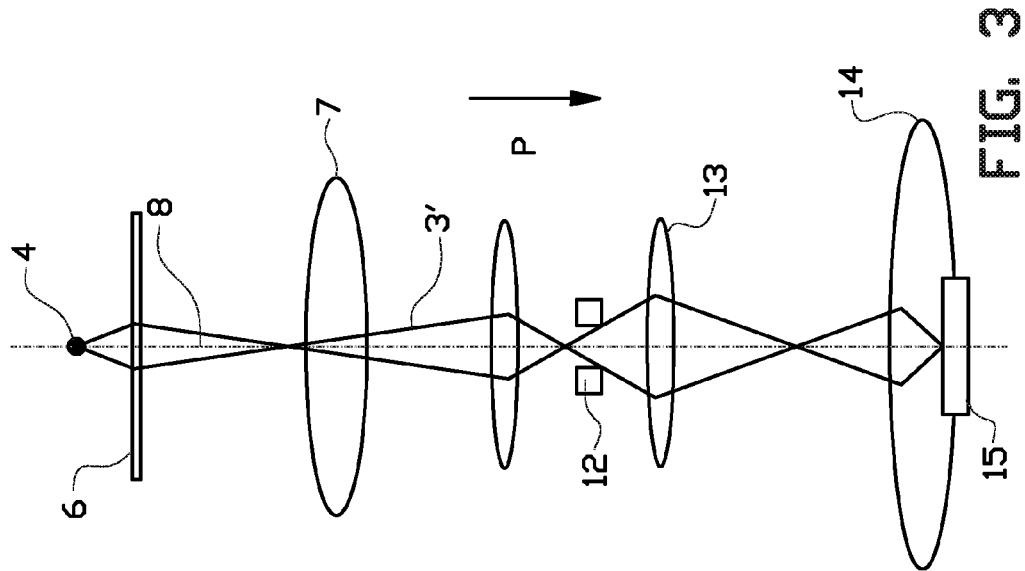
FIG. 3 shows the beam path of one primary electron beam of the array of primary electron beams in the MBSEM of FIG. 1.

The 2nd sub-system as shown in FIG. 3 is arranged to focus each single primary electron beam 3' with good resolution. Aperture lens array 6 is a combination of two mechanical electrodes and an array of apertures, for example of 18 micron diameter with a 25 micron pitch, micro fabricated in a thin Si membrane. It is designed to correct for the field curvature, to have a low spherical aberration, and to nullify the chromatic deflection error. This lens array 6 creates an array of focused primary electron beams in the accelerator lens plane 7, with a geometrical spot size of for example 95 nm at a pitch of for example 70 micron. This ratio of spot size and pitch keeps the same on the sample. The objective lens 14 provides the major focusing contribution to the final spot size and aberration of the primary electron beams on the sample surface 15.

Figure 4:
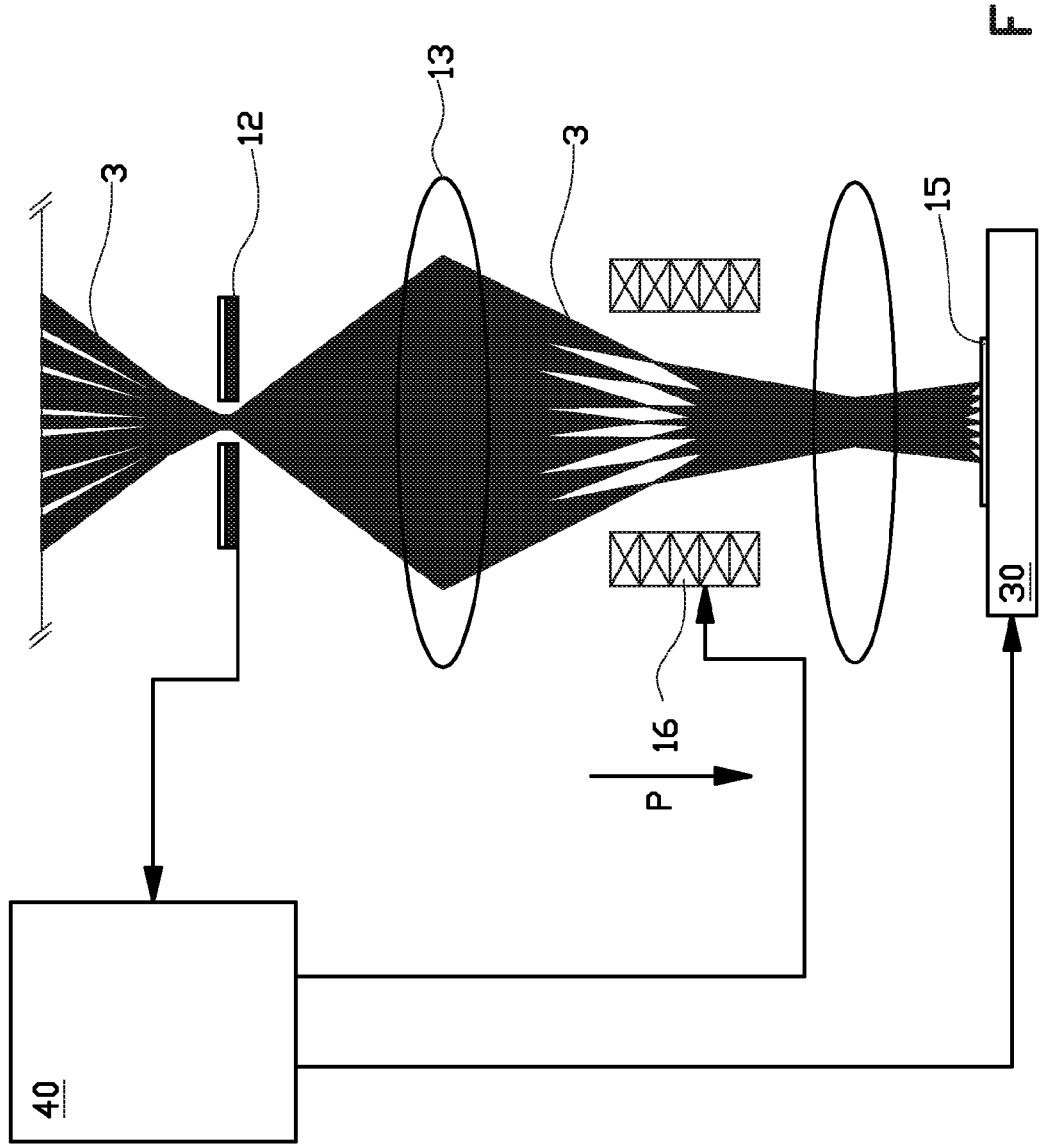
FIG. 4 shows the primary electron beams in the part of the MBSEM of FIG. 1 from the common cross-over to the sample.

The 3rd sub-system as shown in FIG. 5 is arranged to achieve the large magnification of secondary electron beams 20 by analyzing the outline of secondary electron detection system. The intermediate lens 13, and the objective and retarding lens 14' together project the secondary electron beams 20 with sufficient linear magnification in the detection plane of the secondary electron detector 12. A certain given primary beam energy determines the strength of intermediate lens 13, because in charged particle optics, the focusing condition is related to the strength of lens and the energy of electron. So in order to achieve desired magnification, or proper magnification ranges, the energy of secondary electron beam 20, or the potential difference of the electrostatic lens is limited. Proper potential difference should be optimized. After selecting a good potential difference and proper settings of lenses 13, 14, the neighboring secondary electron beams can have large enough pitch to be separately detected by the position sensitive secondary electron detector 12 positioned substantially in the plane comprising said common cross-over of the primary electron beams 3 as shown in FIG. 4.

The 4th sub-system as shown in FIG. 6 provides the focusing situation of single secondary electron beams 21, 22. Under the effect of the lens system 13, 14, each single secondary electron beam 21, 22 is well focused in order to get a small enough spot size in the detection plane 12.

At one landing energy of the primary electron beams on the sample surface 15, the final focusing plane of the secondary electrons, the working distance and the potential difference of the retarding lens are adjustable. Unlike the focusing of the primary electrons, the final focusing plane of the secondary electrons does not have to strictly be fixed in the same position for every landing energy of the primary electrons. The final focusing plane of the secondary electrons just needs to be close to the detection plane 12 as long as it does not give rise to large secondary electron beam spread.

Besides, the pitch of primary beams is also adjustable. By using the condenser lens 10 to change the common cross-over of primary electron beams 3, the total magnification and the pitch of primary electron beams 3 can be changed.

As schematically shown in FIG. 4, the sample 15 is arranged on top of a stage 30 for moving the sample surface 15 with respect to the array of primary electron beams 3. The movement of the stage 30 is controlled by a controller 40. The controller 40 also controls the scan coils 16 and, in this example, also collects the image data obtained by the CCD detector 12.

When inspecting a surface of a sample 15, the MBSEM generates an array of primary electron beams 3 using a multi beam charged particle generator, wherein all primary electron beams 3 are directed to a common cross-over using a condenser lens, wherein the primary electron beams 3 are directed from the common cross-over towards the sample surface 15 and all primary electron beams 3 are focused into an array of individual spots on the sample surface 15 using a lens system 13, 14, and wherein secondary electrons which originate from the individual spots on the sample surface 15 are detected using a position sensitive secondary electron detector 12 positioned at least substantially in or near a plane comprising said common cross-over.

In order to obtain an image of a large surface, in one exemplary embodiment, the sample 15 is moved by the stage 30 in a first direction, preferably at a constant speed, while the primary electron beams 3 are scanned by the scan coils 16 repeatedly in a second direction, which second direction is at least substantially perpendicular to the first direction.

When the primary electron beams 3 are scanned over the sample surface 15, the secondary electron beams 20, 21, may move over the detection surface of the secondary electron detector 12. This movement is for example compensated by selecting the pixels for detecting one specific secondary electron beam in dependence on the settings of the deflection of the primary electron beams 3 by the scan coils 16.

In FIG. 7, an alternative detector set-up is shown. In stead of using a detector 12 which gives a signal when hit directly by secondary electrons 20, 21, 22, such as a CCD, and which can be arranged at the common cross-over and which detector comprises a centre axis, which centre axis is at least substantially arranged at the optical axis of the primary charged particle beam 3 path as discussed in the previous examples, the detector of this alternative detector set-up comprises a fluorescent screen 121 arranged at least substantially in or near a plane comprising said common cross-over and an optical arrangement 122, 123 for conveying photons from the fluorescent screen 121 to a CCD camera, a CMOS camera, an array of avalanche photo diodes or photo multiplier 124. The optical arrangement in this example comprises a mirror 122 which is provided with a through-opening for allowing the primary electron beams 3 to pass there through, and an optical lens 123 for projecting the photons from the fluorescent screen 12 onto the CCD camera 124. An example of such a fluorescent screen 12 is a thin disc of a YAG crystal, provided with a through opening for the primary electrons to pass there through.

Figure 8:
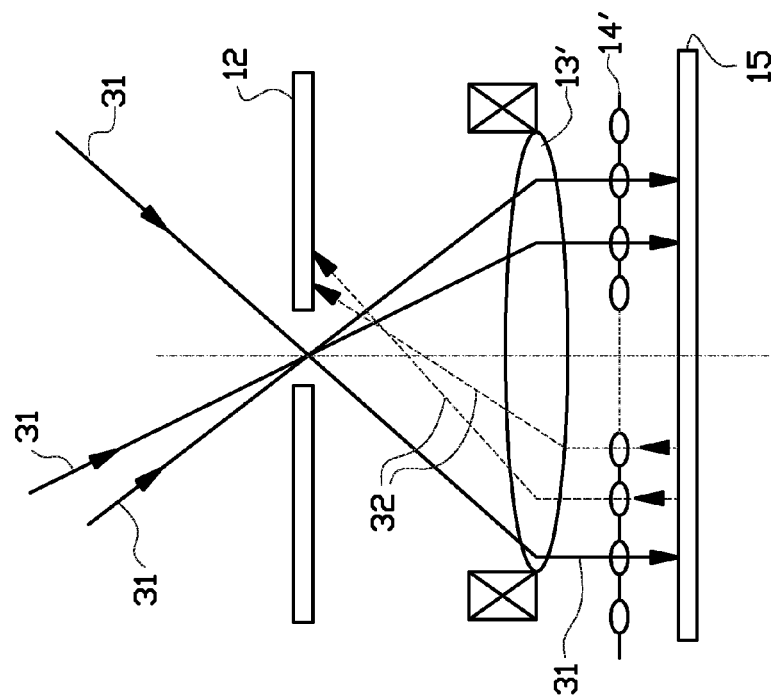
FIG. 8 shows a part of an MBSEM comprising an array of small objective lenses.

In FIG. 8, an alternative of the single lens objective 14 is shown. In the alternative set-up, the lens system 13', 14' comprises an objective lens array 14' having an array of small objective lenses, preferably one lens for each primary electron beam 31. As schematically shown, the primary electron beams 31 pass through the hole in the position sensitive secondary electron detector 12 and are in this example substantially collimated by a collimator lens 13'. Subsequently each primary electron beam 31 is directed to its own lens in the objective lens array 14' which focuses said primary electron beam 31 on the sample surface 15. The secondary electron beams 32 are collected by the lenses of the objective lens array 14' and are projected onto the detecting surface of the secondary electron detector 12.

It is to be understood that the above description is included to illustrate the operation of the preferred embodiments and is not meant to limit the scope of the invention. From the above discussion, many variations will be apparent to one skilled in the art that would yet be encompassed by the spirit and scope of the present invention.

The invention claimed is:

1. An apparatus for inspecting a surface of a sample, wherein the apparatus comprises
 a multi beam charged particle generator for generating an array of primary charged particle beams,
 a condenser lens for directing all charged particle beams to a common cross-over,
 a lens system for directing the primary charged particle beams from the common cross-over towards the sample surface and for focusing all primary charged particle beams into an array of individual spots on the sample surface, wherein the primary charged particle beam path comprises an optical axis,
 wherein the apparatus comprises a position sensitive secondary electron detector with a detection plane positioned at least substantially in a plane which is substantially perpendicular to the optical axis and which comprises said common cross-over, wherein the lens system is arranged for focusing secondary electron beams in the detection plane.

2. The apparatus according to claim 1, wherein the lens system is arranged for projecting the secondary electrons from the individual spots on the sample surface to individual spots on the secondary electron detector.

3. The apparatus according to claim 2, wherein the lens system is arranged for imaging the sample surface onto the secondary electron detector using the secondary electrons.

4. The apparatus according to claim 3, wherein the lens system is arranged for imaging the sample surface onto the secondary electron detector with an optical magnification in a range from 5 to 400 times.

5. The apparatus according to claim 1, wherein said secondary electron detector comprises a hole for passing said primary charged particle beams there-through.

6. The apparatus according to claim 5, wherein said secondary electron detector is arranged such that the common cross-over is at least substantially located in the hole.

7. The apparatus according to claim 1, wherein the lens system comprises a magnetic objective lens.

8. The apparatus according to claim 7, wherein the apparatus comprises a sample holder which is arranged for positioning the sample surface to be immersed in the magnetic field of the objective lens.

9. The apparatus according to claim 1, wherein the lens system comprises a single objective lens.

10. The apparatus according to claim 1, wherein the lens system comprises a objective lens array having an array of small objective lenses.

11. The apparatus according to claim 1, wherein the apparatus comprises a field generator for providing an electrostatic field that accelerates the secondary electrons from the sample surface towards the secondary electron detector.

12. The apparatus according to claim 11, wherein the lens system comprises a magnetic objective lens, wherein the field generator is arranged for providing an electrostatic field between the sample and a pole piece of the magnetic objective lens.

13. The apparatus according to claim 1, wherein the pitch between the spots on the sample surface is between 0.3 and 30 micrometers.

14. The apparatus according to claim 1, wherein the detector is a CCD camera, a CMOS camera, an array of avalanche photo diodes, photo multipliers or PN junction semiconductor detector which gets signal from secondary electrons directly.

15. The apparatus according to claim 1, wherein the detector comprises a fluorescent screen arranged at least substantially in or near the plane comprising said common cross-over and an optical arrangement for conveying photons from the fluorescent screen to a CCD camera, a CMOS camera, an array of avalanche photo diodes or photo multiplier.

16. A method for inspecting a surface of a sample comprising the steps of:
 generating an array of primary charged particle beams using a multi beam charged particle generator;
 directing all charged particle beams to a common cross-over using a condenser lens, wherein the primary charged particle beam path comprises an optical axis;
 directing the primary charged particle beams from the common cross-over towards the sample surface and focusing all primary charged particle beams into an array of individual spots on the sample surface using a lens system;
 wherein the lens system is arranged for focusing secondary electron beams in the detection plane; and
 detecting secondary electrons which originate from the individual spots on the sample surface using a position sensitive secondary electron detector with a detection plane positioned at least substantially in a plane which is substantially perpendicular to the optical axis and which comprises said common cross-over.

17. The method according to claim 16, in which the sample surface is moved at constant speed in a first direction while the primary charged particle beams are scanned repeatedly in a second direction at least substantially perpendicular to the first direction.

18. The method according to claim 17, in which the lens system comprises a scanner for scanning the primary charged particle beams, wherein the method comprises the step of selecting pixels for detecting one specific secondary electron beam in dependence on the settings of the scanning of the primary charged particle beams by the scanner.

\* \* \* \* \*